United States Patent [19]

Tamura et al.

[11] Patent Number: 5,641,985

[45] Date of Patent: Jun. 24, 1997

[54] ANTIFUSE ELEMENT AND SEMICONDUCTOR DEVICE HAVING ANTIFUSE ELEMENTS

[75] Inventors: Yoshimitsu Tamura; Hiroshi Shinriki; Tomohiro Ohta, all of Chiba, Japan

[73] Assignee: Kawasaki Steel Corporation, Hyogo-ken, Japan

[21] Appl. No.: 353,294

[22] Filed: Dec. 5, 1994

[30] Foreign Application Priority Data

Sep. 29, 1994 [JP] Japan .................................. 6-235057
Sep. 29, 1994 [JP] Japan .................................. 6-235058

[51] Int. Cl.⁶ .......................... H01L 29/04; H01L 27/10; H01L 29/00
[52] U.S. Cl. .................... 257/530; 257/50; 257/52; 257/209; 257/528
[58] Field of Search ............................ 257/50, 52, 528, 257/530, 209

[56] References Cited

U.S. PATENT DOCUMENTS

| | | | |
|---|---|---|---|
| 5,166,556 | 11/1992 | Hsu et al. | 257/530 |
| 5,404,029 | 4/1995 | Husher et al. | 257/530 |
| 5,502,315 | 3/1996 | Chua et al. | 257/530 |

OTHER PUBLICATIONS

Babcock et al., "Ti–W Contacts to Si", J. Appl. Phys. 53(10), American Institute of Physics, Oct. 1982, pp. 6898–6905.
Y.K. Fang et al. "Observations on the phase transformation and its effect on the resistivity of $WSi_2$ films prepared by low–pressure chemical vapor deposition," J. Appl. Phys. 57(8), 15 Apr. 1985, pp. 2980–2982.

N. Matsukawa et al., "New Models for Sheet Resistance Increase of Titanium Silicide Layers Formed on As Ion Implanted Si Substrates," Jun. 7–8, 1994 VMIC Conference, pp. 475–477.

*Primary Examiner*—Mahshid D. Saadat
*Assistant Examiner*—Valencia Martin Wallace
*Attorney, Agent, or Firm*—Oliff & Berridge

[57] ABSTRACT

Antifuse elements for a semiconductor device comprise a bottom electrode, a top electrode, and an antifuse material layer. The bottom electrode is formed of a conductive material having an amorphous structure. The conductive material contains such elements as W, Ti, or a compound thereof. Since there is no grain boundary on the surface of the bottom electrode having an amorphous structure, any sharp protrusions are diminished to promote the smoothness. The antifuse material film is mounted on the surface of the bottom electrode. The bottom electrode contains such elements having an excellent EM resistance as W, Mo. These elements are also to be contained in a filament which is formed after programming.

13 Claims, 12 Drawing Sheets

ANTIFUSE ELEMENT AND SEMICONDUCTOR DEVICE HAVING ANTIFUSE ELEMENTS

BACKGROUND OF THE INVENTION

1. Field of the Invention

The present invention relates to an antifuse element and a semiconductor device having antifuse elements. Such a semiconductor device is applicable to a field programmable gate array (hereinafter referred to as FPGA), a programmable read only memory (hereinafter referred to as PROM), or the like.

2. Description of the Related Art

A semiconductor integrated circuit device, incorporating a FPGA and PROM as gate arrays capable of being programmed in place by a user, is provided with antifuse elements. An antifuse element is composed, as mentioned in the following references, of a bottom electrode, an antifuse material layer, and a top electrode (IEEE, Electron Device Letter, Vol. 12, No. 4, April 1991 pp. 151–153, IEEE, Electron Device Letter, Vol. 13, No. 9, September 1992 pp. 488–490).

The antifuse material layer is previously formed between the bottom electrode and the top electrode of the antifuse element, and is capable of being broken down to provide an electrical connection. When it is broken down, there is formed a filament for electrically connecting the bottom electrode to the top electrode. A relatively high breakdown voltage is applied between a bottom electrode and a top electrode of the selected antifuse element.

The FPGA can be desirably programmed since the conduction or non-conduction between the bottom electrode and the top electrode is free after completion of the wiring process. Meanwhile, in the PROM, a data writing operation can be freely perfomed after completion of the wiring process.

In such an antifuse element, the following points have not been considered.

Firstly, in an antifuse element the antifuse material layer is formed on the surface of the bottom electrode in a through hole. The bottom electrode is formed in the same manufacturing process for metal interconnects. In the case of using a metallic film such as a barrier metal for the metal interconnect, there will arise unevenness or protrusions which may be sharp on the surface of the bottom electrode due to the crystal grains of the barrier metal. In view of this, at the time of breaking down the antifuse material layer, a relatively low electric field is locally applied to the antifuse material layer being formed at the plane or smooth portion of the surface of the bottom electrode, while a relatively high electric field is locally applied to the antifuse material layer being formed at portions with sharp protrusions. In other words, the breakdown state of the antifuse material layer varies in each antifuse element or depending on the location of the same in an antifuse opening. As a result, there will arise variations in ON resistance when an operational voltage is applied to the connecting portion between the bottom electrode and the top electrode. Such a variation in ON resistance will lead to a variation of the delay time of metal interconnects. As a result, the thus completed FPGA and PROM have a varying program reading speed and data reading speed respectively, so as to significantly reduce the reliability in the semiconductor device incorporating such antifuse elements.

Secondly, in the antifuse element, the bottom electrode must be electrically connected to the top electrode at the breakdown portion of the antifuse material layer, while the same must be reliably insulated at the unbroken portion thereof. For satisfactorily meeting this requirement, however, the antifuse material layer must be formed in large thickness taking account of the margin to be lost due to the sharp protrusions on the surface of the bottom electrode. Consequently, a higher breakdown voltage will be required to break down such a thick antifuse material layer. Meanwhile, however, there has been a tendency to lower the operational voltage of the semiconductor device in accordance with the higher integration of the circuits. Therefore, a sufficiently high breakdown voltage cannot be supplied unless any special means such as a voltage step-up circuit is provided. In other words, the aforementioned antifuse structure cannot cope with the tendency to lower the operational voltage of the semiconductor device.

Thirdly, in the antifuse element, the connecting cross-sectional area is small because there is only a local connection between the bottom electrode and the top electrode. Further, the metallic composition ratio of the filament will vary due to the breakdown of the antifuse material layer to form the filament. Accordingly, the application of the operational voltage will relatively increase the ON resistance so as to cause the delay time in the metal interconnect, making it impossible to increase the operational speed of the semiconductor device.

Fourthly, in the antifuse element, the heat reaction caused by Joule heat generated at the time of the breakdown of the antifuse material film will produce compounds, which constitute the filament. When both the bottom electrode and the top electrode contain mainly Al, the compounds forming the filament will also contain Al as the main component, leading to the decrease of EM (Electro-Migration) resistance in the filament. Accordingly, a long-time application of the operational voltage to the filament will enhance the probability of disconnection of the filament due to the EM, reducing the realiability for long-time operation of the semiconductor device.

SUMMARY OF THE INVENTION

It is therefore an object of this invention to provide antifuse elements for a semiconductor device which is capable of reducing the variation of ON resistance between the top electrode and the bottom electrode to enhance the reliability.

It is a second object of this invention to reliably perform the electric conection and insulation between the top electrode and the bottom electrode, to set a low breakdown voltage for the antifuse material layer, and to assure a low operational voltage of the semiconductor device.

It is a third object of this invention to reduce the ON resistance between the top and bottom electrodes in order to increase the operational speed of the semiconductor device.

It is a fourth object of this invention to increase the EM resistance between the top electrode and the bottom electrode to provide enhanced long-term reliability.

In view of the aforementioned objects, antifuse elements for a semiconductor device according to a first aspect of this invention feature a bottom electrode or an uppermost layer of the bottom electrode which is formed of conductive material having an amorphous structure. This conductive material having an amorphous structure is also used in the top electrode or the lowest layer of the top electrode of the antifuse element.

In such antifuse elements for a semiconductor device, no grain boundary appears on the surface of the bottom electrode of the antifuse element. Therefore, sharp protrusions on the surface of the bottom electrode can be diminished to promote the smoothness thereof. This contributes to reduced defects in the antifuse material film formed on the surface of the bottom electrode so as to provide a uniform and desirable quality. In the filament of the thus formed antifuse element, there is a reduced variation of ON resistance between the bottom electrode and the top electrode. Further, it becomes possible to reliably dielectrically separate the bottom electrode from the top electrode, even with a small thickness of the antifuse material film. In addition, the long-term reliability of the dielectric characteristics of the antifuse material film can be enhanced.

A second aspect of this invention features that among the conductive materials having amorphous structure to be used for the antifuse element, a metallic composition of the compounds formed by metallic elements and non-metallic elements is set to be larger than a stoichiometric composition ratio.

In such antifuse elements, when a breakdown voltage is applied between the bottom electrode and the top electrode to break down the antifuse material film so as to form a filament, the metallic elements are diffused to the filament from the conductive material having an amorphous structure. As a result, Joule heat generated at the breakage will produce crystal compounds. Since the composition ratio of the metallic elements of the conductive material is set to be larger than the stoichiometric composition ratio thereof, a larger amount of the metallic elements will be reliably supplied at the time of production of the crystal compounds so as to reduce the resistance in the filament. This reduction of the resistance in the filament will further promote the breakage of the antifuse material film, extending the cross-sectional area of the filament, so as to further reduce the resistance in the filament.

A third aspect of this invention features that oxides or nitrides naturally formed on the surface of the bottom electrode of the antifuse element are removed by wet chemical pre-cleaning using ammoniacal hydrogen peroxide solution or the like. At this time, a new oxide film is formed as a part of the film thickness being removed in the depth direction from the surface of the bottom electrode in the range of the conductive material of amorphous structure. Thus, the antifuse material film including the new oxide film will be formed on the bottom electrode.

In such antifuse elements for a semiconductor device, oxides with poor film quality or nitrides with sharp protrusion formed on the surface of the bottom electrode are removed to promote the smoothness of the surface of the bottom electrode. The smoothnesss of the surface of the bottom electrode can be further promoted by the partial removal of the film thickness of the surface of the bottom electrode. In particular, the application of the wet chemical pre-cleaning using ammoniacal hydrogen peroxide solution will serve to remove the surface of the bottom electrode and to form a new oxide film with an exellent film quality which is smooth. As a result, it is possible to provide an antifuse material film, with reduced defects and uniform and excellent quality, on the surface of the bottom electrode.

A fourth aspect of this invention features that a negative or positive voltage is applied to the bottom electrode, while a positive or negative voltage is applied to the top electrode, and that the filament formed by the breakage of the antifuse material film caused by the application of the voltage, contains any of W, Ta, Nb or Mo among conductive materials having amorphous structure.

In such antifuse elements for a semiconductor device, the filament of the antifuse element contains substances with an excellent EM resistance so as to make the filament itself have the EM resistance. Accordingly, a connected state can be maintained for a long time between the bottom electrode and the top electrode. In particular, when any of W, WSix, or WNx is produced in the filament, the filament will have not only the excellent EM resistance but also a smaller specific resistance. In consequence, almost no deterioration will appear to improve the stability and to provide processing reliability in the semiconductor manufacturing technology. In addition, since a negative voltage is applied either to the bottom electrode or to the top electrode which has a metallic element with an excellent EM resistance, the programming operation can be completed in a shorter time. In the programming operation, a large amount of electron flow appears at the time of breakage of the antifuse material film (i.e. a high current density appears) to carry the metallic elements excellent in EM resistance to the filament, so as to enhance the EM resistance in the filament itself.

The above and other objects, features and advantages of the present invention will become clear from the following description of preferred embodiments thereof, taken in conjunction with the accompanying drawings.

DETAILED DESCRIPTION OF THE PREFERRED EMBODIMENTS

This invention will now be described by way of embodiments.

First Embodiment

Figure 1A:
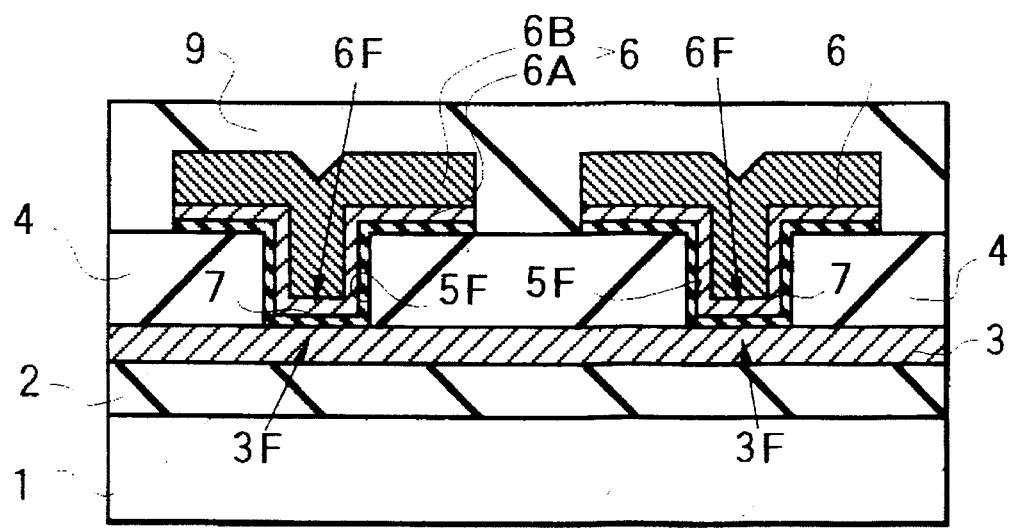
FIG. 1A is an essential cross-sectional view of antifuse elements for a semiconductor device before programming according to a first embodiment of this invention.

FIG. 1A is a cross-sectional view showing metal interconnect layers of antifuse elements for a semiconductor device according to a first embodiment of this invention. In this embodiment, a FPGA or a PROM is incorporated in the semiconductor device.

As shown in FIG. 1A, metal interconnect layers of antifuse elements are formed on a semiconductor substrate 1 of the semiconductor device. The substrate 1 is formed of a single-crystal silicon substrate, for example. On the main surface of the substrate 1, a semiconductor element such as a MISFET (Metal Insulator Semiconductor Field Effect Transistors) constituting a FPGA or a PROM, not shown, are mounted.

In this embodiment, the metal interconnect layers are composed of two-layer structure including a first level metal interconnect 3 and a second level metal interconnect 6 formed thereover. The first level metal interconnect layer is formed on an inter-layer dielectric film 2 covering the semiconductor element. In FIG. 1, the metal interconnect 3 is arranged in parallel to the direction perpendicular to the page, extending from the left side to the right side of the page. The second level metal interconnect 6 is formed on an inter-layer dielectric film 4 covering the metal interconnect 3 therein. In FIG. 1, the metal interconnect 6 is arranged in the direction of crossing the metal interconnects 3, namely from the left side to the right side, and extending in the direction perpendicular to the page. The metal interconnects 3 and 6 are electrically connected to each other via a through hole (not shown) formed in the inter-layer dielectric film 4. These metal interconnects 3 and 6 are used as means for connecting the circuits such as logic circuits.

The antifuse elements are incorporated in the metal interconnects for connecting the circuits, and are used as elements for selecting whether the circuits should be connected or not. The antifuse element is composed of a bottom electrode 3F, an antifuse material film 7 and a top electrode 6F. In this embodiment, the bottom electrode 3F is formed in the first level metal interconnect 3 and in the same process as that for the first level metal interconnect 3. The top electrode 6F is formed in the second level metal interconnect 6 and in the same fabrication process as that for the metal interconnect 6. The antifuse material film 7 is formed between the bottom electrode 3F and the top electrode 6F, and in an antifuse opening 5F in the same fabrication process as that for the through hole formed between the metal interconnects 3 and 6.

In the aforementioned antifuse element, the bottom electrode 3F, at least its top portion being in direct contact with the antifuse material film 7, is formed of any conductive material having an amorphous structure. This conductive material is composed of any element or compound of the following (1)–(10):

(1) at least two elements of a first element group including Fe, Co, Ni, Cu, Mn, Ti, V, Cr, Zr, Nb, Mo, Hf, Ta and W;

(2) a compound formed by at least one element of the first element group and at least one element of a second element group including Si, B, N, C, Ge, As, P and Sb;

(3) a compound formed by at least one element of the first element group, at least one element of the second element group and one element of a third element group including Y and La;

(4) a compound formed by at least one element of the first element group and Al;

(5) a compound formed by at least one element of the third element group and Al;

(6) a compound formed by at least one element of the first element group, at least one element of the third element group, and Al;

(7) a compound formed by any one element of a fourth element group including Au, Pt, Pd and Ag, and at least any one element of the second element group;

(8) a compound formed by at least one element of the first element group and any one element of the fourth element group;

(9) a compound formed by at least any one element of the third element group and any one element of the fourth element group; and

(10) a compound formed by at least any one element of the first element group, at least any one element of the third element group, and any one element of the fourth element group.

According to the thus composed antifuse element, no grain boundary appears on the surface of the bottom electrode 3F, so that any sharp protrusions on the surface of the bottom electrode 3F are diminished to promote the smoothness thereof.

Among the conductive materials having amorphous structure, particularly heavy metallic elements with low self-diffusion coefficient, specifically W, Ta, Nb or Mo, or compounds including any of these, have an exellent EM resistance. Such compounds include silicides (e.g. WSix) and nitrides (e.g. WNx film).

In this embodiment, a titanium silicide film or a tungsten silicide film, both having amorphous structure, is used as the bottom electrode 3F. The tungsten silicide film has an especially excellent EM resistance and a low ratio resistance which hardly deteriorates, rendering high stability and high processing reliability in the semiconductor manufacturing technology.

In this embodiment, the top electrode 6F of the antifuse element is composed of a two-layer structure including a titanium nitride film 6A and an aluminum alloy film 6B which are sequentially layered. In the top electrode 6F, at least the lowest layer being in direct contact with the antifuse material film 7 can also be formed of the same conductive material having an amorphous structure as in the bottom electrode 3F.

In the cross-sectional structure shown in FIG. 1A, the antifuse material film 7 is interposed between the bottom electrode 3F and the top electrode 6F of the antifuse element to put both electrodes in a nonconductive state, preventing current flow. The FPGA is in an unprogrammed state, while the PROM is in non-data writing state.

Figure 1B:
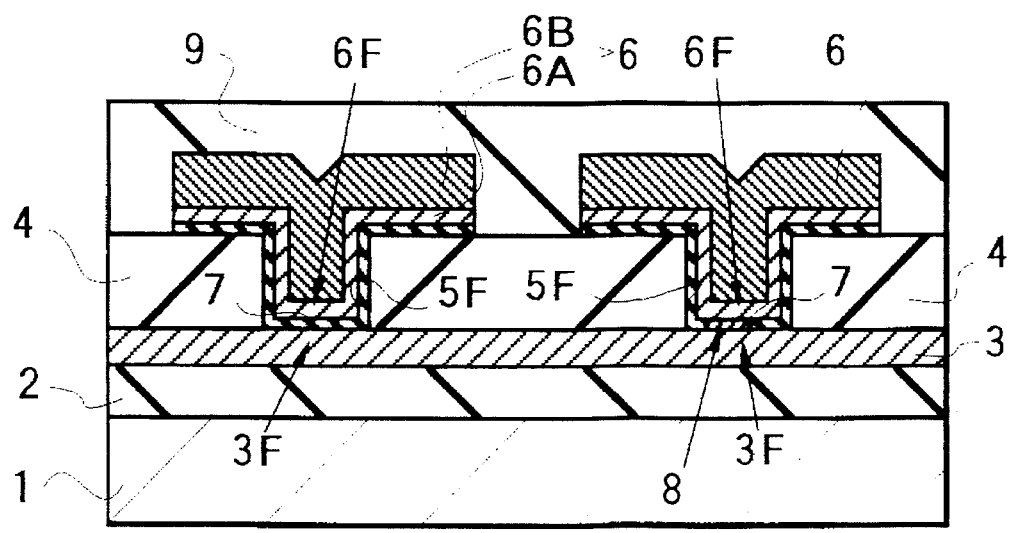
FIG. 1B is the same but after programming.

In the cross-sectional structure shown in FIG. 1B, the antifuse material film 7 of any (in this case the right side one) antifuse element is broken down to form a filament 8 between both the bottom electrode 3F and the top electrode 6F. The FPGA is now in a programmed state, while the PROM is in a date-written state. A final passivation film 9 is formed on the metal interconnects 6.

A method for manufacturing the antifuse element, in particular the metal interconnect, will now be described with reference to FIGS. 2A–2D, which are cross-sectional views of antifuse elements for a semiconductor device, illustrating manufacturing processes.

Figure 2A:
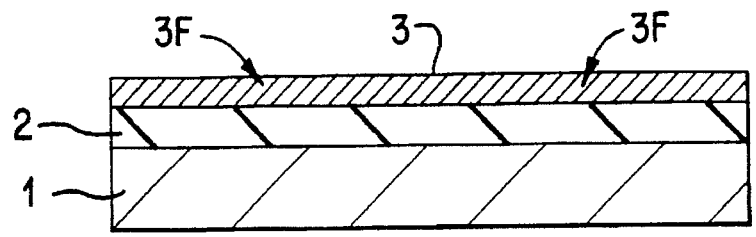
FIGS. 2A, 2B, 2C and 2D are cross-sectional views showing fabrication processes for manufacturing antifuse elements for the semiconductor device.

In the first process, as shown in FIG. 2A, a plurality of first level metal interconnects 3 are formed on the interlayer dielectric film 2, and the bottom electrode 3F of the antifuse element is formed in the same fabrication process. In this embodiment, a titanium silicide film or a tungsten silicide film is used for the metal interconnect 3 and the bottom electrode 3F.

In the case of using the titanium silicide film, it is formed by any of a sputtering method, a CVD method, or a solid phase reaction method, so as to have an amorphous structure. Particularly in the sputtering method, the substrate temperature is set to 100° C., using a target material having a composition ratio of Ti:Si=1:1.8. The titanium silicide film is formed to have a thickness of 200 nm. The composition ratio of the titanium silicide film is set to the same value as that of the target material, namely with a larger percentage of Ti. After the formation of the titanium silicide film, processes except heat treatment at in excess of 700° C. are applied to maintain the amorphous structure. The titanium silicide film formed by the sputtering method basically has the amorphous structure, but a heat treatment (annealing) is normally applied after the film formation to crystallize the film. In this embodiment, however, no heat treatment process is added for crystallization, but low temperature treatments not reaching the crystallizing temperature are used in a variety of processes after the film formation.

In the case of using the tungsten silicide film, the CVD method, in particular a plasma CVD method, is usually adopted. In this plasma CVD method, there are employed such conditions as: substrate temperature 250° C.; pressure 0.5 torr, $WF_6$:$SiH_4$=1:4; and flow rate 300 sccm. The tungsten silicide film formed under such conditions has a composition ratio of W: Si=1:1, with a larger ratio of W. In the same manner, processes other than heat treatment at temperatures exceeding the crystallizing temperature are used to maintain the amorphous structure of the tungsten silicide film.

The thus formed titanium silicide film or the tungsten silicide film having an amorphous structure has no crystal grain boundary on its surface, so that unevenness and sharp protrusions due to the crystal grains are diminished, so as to promote the smoothness of the surface of the bottom electrode 3F. Accordingly, the antifuse material film 7 formed on the surface of the bottom electrode 3F in a subsequent process will have fewer defects to render uniform and excellent film quality.

Figure 2B:
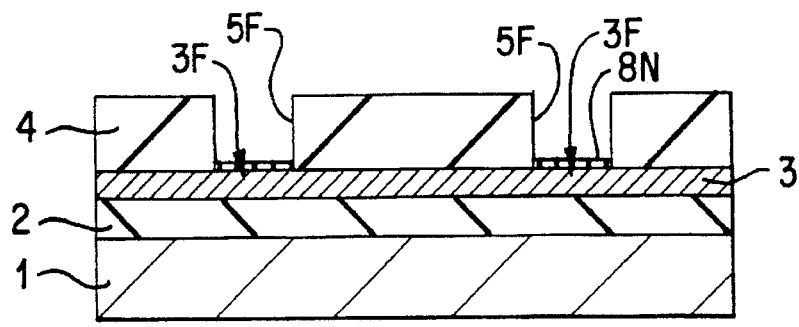

In the second process, the inter-layer dielectric film 4 is formed over the whole substrate surface including the metal interconnect 3 and the bottom electrode 3F. The through hole (not shown) is formed in the inter-layer dielectric film 4 on the predetermined metal interconnect 3, while the antifuse opening 5F is formed in the bottom electrode 3F (FIG. 2B). The inter-layer dielectric film 4 is formed of a silicon oxide film, for example, which has a thickness of e.g. 1.0 μm. The through hole and the antifuse opening 5F are both formed by photolithographic and etching techniques to have an opening diameter of 1.0 μm or the like.

In the third process, as shown in FIG. 2B, a wet process is applied to at least the bottom electrode 3F within the antifuse opening 5F, namely on the surface of the titanium silicide film or the tungsten silicide film. The wet process is applied for removing oxides or nitrides naturally formed on the surface of bottom electrode 3F during the film formation or exposure to the atmosphere, and for further removing a part of the film thickness in the depth direction from the surface of the bottom electrode 3F. In this embodiment, an ammoniacal hydrogen peroxide water ($NH_4OH$:$H_2O_2$:$H_2O$= 1:1:5, 70° C.) is employed (APM cleaning is used) to carry out the wet process for five minutes, for example. In the case of performing the wet process, oxides with poor film quality or nitrides with sharp protrusions are removed. Further, the bottom electrode 3F is partly removed, so as to eliminate protrusions on its surface resulting from the natural oxide or nitride and to produce a new uniform oxide film 8N. This new oxide film 8N can be formed with a uniform and excellent quality since the surface of the bottom electrode 3F is already smoothed. Thus the smoothness of the surface of the bottom electrode 3F can be promoted.

Alternatively it is also possible to use a dry process instead of the wet process so far as the same effect can be rendered. Specifically, an isotropic chemical dry etching process using a fluorine-type gas. For the aforementioned isotropic chemical dry etching process, either a non-plasma method using $ClF_3$-type gas ($ClF_3$ cleaning) or a non-plasma method using $F_2$-type gas ($F_2$ cleaning) can be employed. In the non-plasma method using the $ClF_3$-type gas, processes are carried out under such conditions as Ar:$ClF_3$=9:1, 100 torr and a process time of one minute. When using $F_2$-type gas, processes are carried out under such conditions as $F_2$:$H_2$=3:97, 1000 sccm, 1.0 torr, substrate temperature 200° C. and a process time 3 minutes.

Further, for the isotropic chemical dry process, plasma etching may be used using $NF_3$-type gas ($NF_3$ cleaning); $BCl_3$-type gas ($BCl_3$ cleaning); or a mixed gas of $CF_4$-type gas and $O_2$ gas. In such a plasma method, when using the $BCl_3$-type gas, the processes will be carried out under such conditions, for example, as $BCl_3$:Ar=4:1, 100 sccm, 0.1 torr, high-frequency 13.56 MHz, substrate temperature 200° C. and a process time of 3 minutes. When using the mixed gas, the processes are carried out under such conditions as: $CF_4$:$O_2$=8:2; 100 sccm; 0.1 torr; high-frequency 13.56 MHz; substrate temperature 30° C.; and a process time of 2 minutes.

It is also possible to use, as the processing gas, any of such fluorine-type gas as $CF_4$, $C_2F_6$, $CH_2F_2$, $CH_3F$, or $SF_6$.

The etching process in any case is performed at a low temperature not exceeding 200° C. Namely, when the etching process is carried out at such a low temperature, the amorphous structure of the bottom electrode can be maintained intact without any grain boundary, so that the antifuse material film 7 for the next process can be formed on the smoothed surface of the bottom electrode 3F being promoted.

Figure 2C:
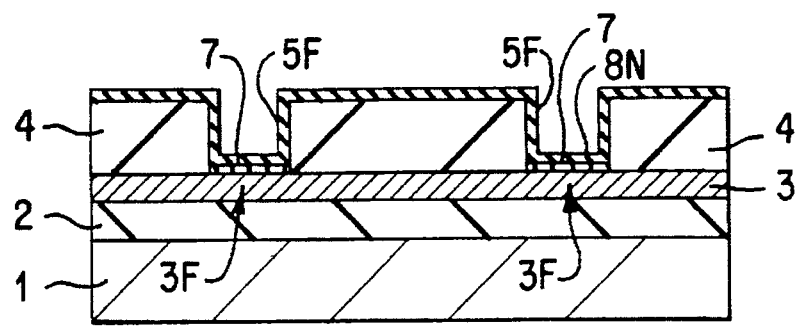

In the fourth process, as shown in FIG. 2C, the antifuse material film 7 is formed on the bottom electrode 3F in at least the antifuse opening 5F. In this embodiment, the antifuse material film 7 is formed over the whole surface of the substrate including the surface of the bottom electrode 3F and the inter-layer dielectric film 4 in the antifuse opening 5F. The antifuse material film 7 is composed of silicon nitride film, deposited by the plasma CVD method using the gas phase reaction of $SiH_4$, $NH_3$ and $N_2$. In this embodiment, the deposition conditions are set as follows: substrate temperature 350° C.; $SiH_4$ 1700 sccm; $NH_3$ 500 sccm; $N_2$ 300 sccm; pressure 0.35 torr; high-frequency 50 KHz; and high-frequency 0.98 KW. The antifuse material film 7 has a film thickness of 5–20 nm (in this embodiment, 10 nm). This antifuse material film 7 formed on the surface of the bottom electrode 3F having less sharp protrusions is a uniform and fine quality film.

As the antifuse material film 7, it is also possible to use, instead of silicon nitride film, a mono-layer film of silicon oxide film or tantalum oxide film, or a complex film of any combination of silicon nitride film, silicon oxide film, and tantalum oxide film.

In the case of any atmospheric release existing between the processes, a natural oxide film of poor quality tends to be formed on the surface of the bottom electrode 3F. By removing this natural oxide film using a wet process and further removing a portion of the surface of the bottom electrode 3F, a thin new oxide film 8N is formed on the smoothed surface of the bottom electrode 3F, so that the surface of the new oxide film itself can also be smoothed. As a result, the antifuse material film 7 formed on the new oxide film will have a good film quality. In this embodiment, the new oxide film and the antifuse material film 7 perform the actual dielectric role.

Figure 2D:
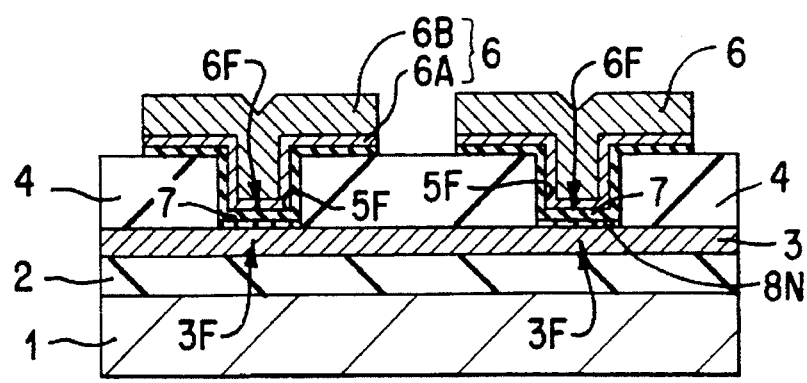

In the fifth process, as shown in FIG. 2D, the second level metal interconnect 6 comprising a plurality of conductor strips is formed on the inter-layer dielectric film 4, and the top electrode 6F of the antifuse element is formed in the same fabrication process. Practically, the antifuse material film 7 is formed on the whole surface of the inter-layer dielectric film 4, so that both the metal interconnects 6 and the top electrode 6F are formed on the antifuse material film 7. In this embodiment, the metal interconnects 6 and the top electrode 6F are composed of a two-layer structure made by superimposing the aluminum alloy film 6B on the titanium nitride film 6A. The lower layer, the titanium nitride film 6A, is deposited by the reactive sputtering method or the CVD method to a thickness of 100 nm.

Figure 3:
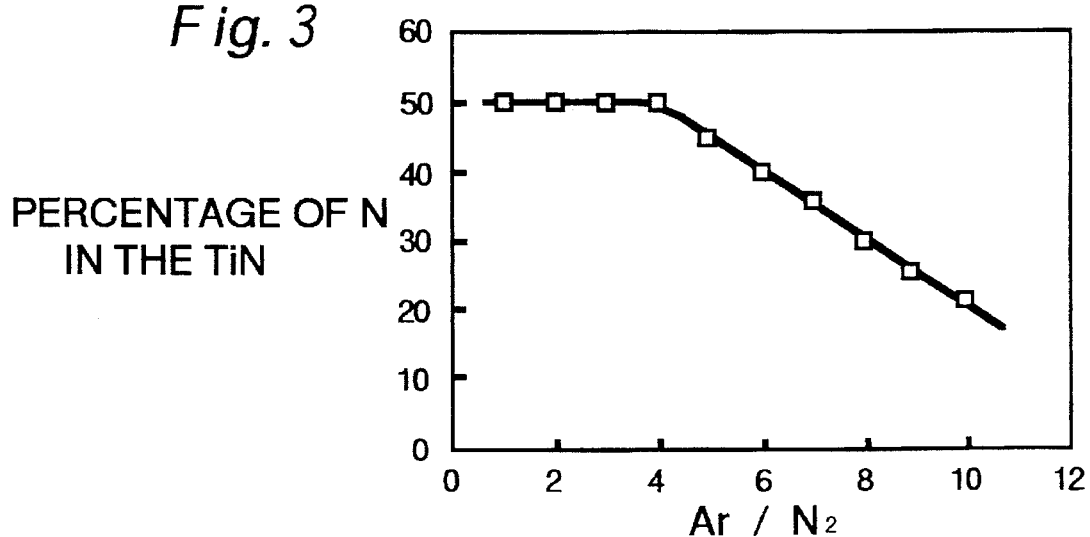
FIG. 3 is a graph showing a relationship between a composition ratio of titanium nitride and a mixed gas ratio.

Further, in the titanium nitride film 6A, the metallic composition ratio (namely the composition ratio of Ti) is set to be larger than the stoichiometric composition ratio. More particularly, the composition ratio of the Ti is set to be 55% or more. In the case of the titanium nitride film 6A being formed by the reactive sputtering method, the film is formed by use of the Ti target material under such accumulative conditions as: substrate temperature=100° C.; mixture gas ratio $Ar:N_2=7$ approximately; pressure=4 torr; high-frequency=13.65 MHz; and high-frequency=400 W. FIG. 3 shows a relationship between the composition ratio of the mixed gas and the titanium nitride film. The amount of Ti of the titanium nitride film depends on the amount of $N_2$ of the $Ar-N_2$ mixed gas. As shown in the figure, in order to set the composition ratio of Ti to be larger than the stoichiometric composition ratio, the ratio of $Ar/N_2$ must be 5 or more. In this embodiment, the mixed gas ratio is set to 7 as mentioned earlier. When the composition ratio of Ti is set to be larger than the stoichiometric composition ratio of the titanium nitride film 6A, the Ti content in the filament 8 formed by the breakdown of the antifuse material film 7 will become larger, leading to reduced ratio resitance.

The aluminum alloy film of the top layer is accumulated by the sputtering method or the CVD method to a thickness of 800 nm. The metal interconnects 6 and the top electrode 6F are patterned together with the antifuse material film 7 as a base, after the forming of the titanium nitride film 6A and the aluminum alloy film 6B. The photolithographic and etching techniques are used for the patterning.

A titanium silicide film can also be used instead of the titanium nitride film 6A of the bottom electrode in the metal interconnects 6. In the case of using the titanium silicide film, the amount of Ti is set to be 40% or more. The composition ratio of Ti of the titanium silicide film largely depends on the composition ratio of Ti of the target material at the time of film formation by the sputtering method, which will be approximately the same as that of Ti of the titanium silicide film. Accordingly, the composition ratio of Ti of the titanium silicide film can be readily controlled by adjusting the composition ratio of Ti of the target material.

It is also possible to set the composition ratio of Ti of the bottom electrode 3F to be greater than the stoichiometric composition ratio. Furthermore, when using tungsten for the bottom electrode 3F, the W composition ratio can also be set to a value larger than the stoichiometric composition ratio.

Moreover, the lower titanium nitride film 6A of the top electrode 6F can have a noncrystalline structure similar to the the bottom electrode 3F.

In the sixth process, as shown in FIG. 1A, a final passivation film 9 is formed.

In the thus formed antifuse elements for the semiconductor device, as shown in FIG. 1B, a desired antifuse element is selected, and a breakdown voltage (programming voltage) is applied between the bottom electrode 3F and the top electrode 6F to form the filament 8 therebetween. The filament 8 is formed by compounds generated by the mutual diffusion of the titanium silicide film or the tungsten silicide film of the bottom electrode 3F, the antifuse material film 7 and the titanium nitride film 6A of the top electrode 6F. In the filament 8, Ti or W of the bottom electrode 3F, and the Ti of the titanium nitride film 6A of the top electrode 6F are contained in sufficient amounts to reduce the resistance of the filament 8.

Figure 4A:
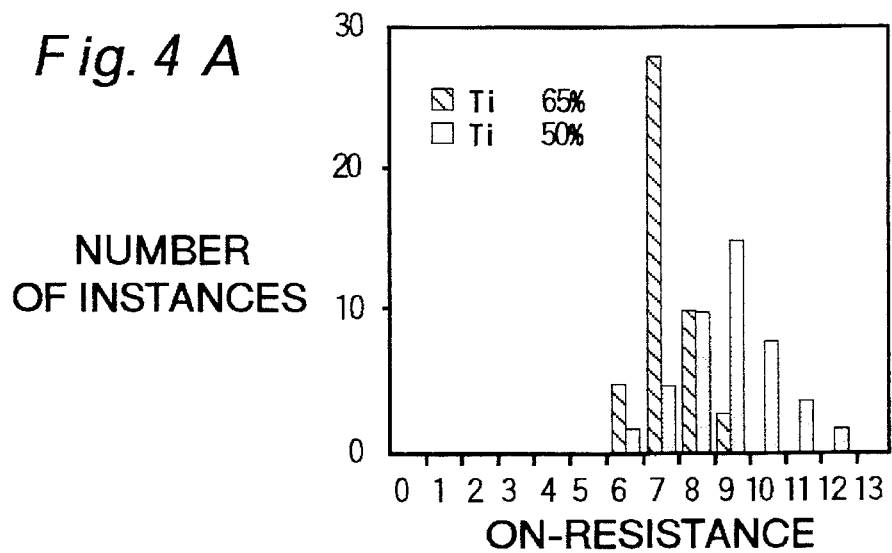
FIG. 4A is a histogram showing a distribution of ON resistance of an electrode for different metallic composition amounts.
Figure 4B:
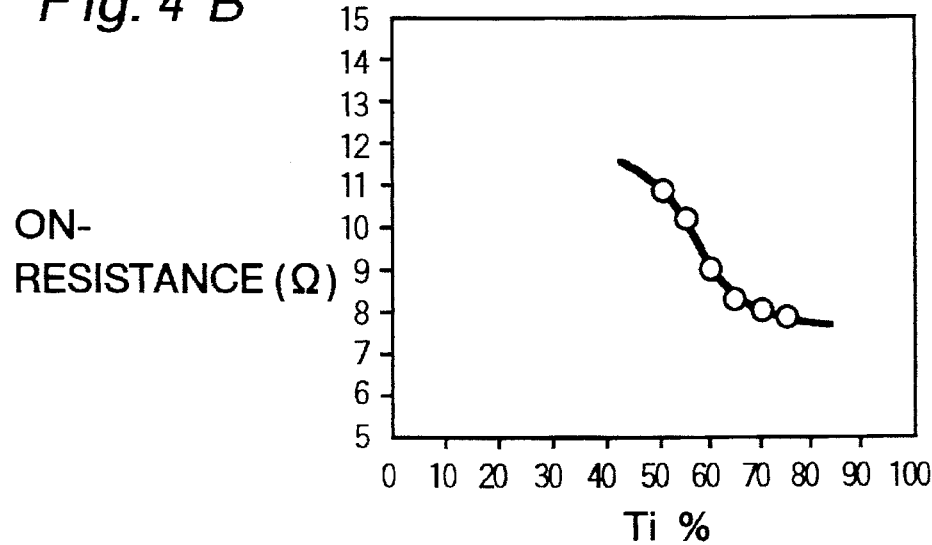
FIG. 4B is a graph showing a relationship between a metallic composition ratio and ON resistance of an electrode.
Figure 4:
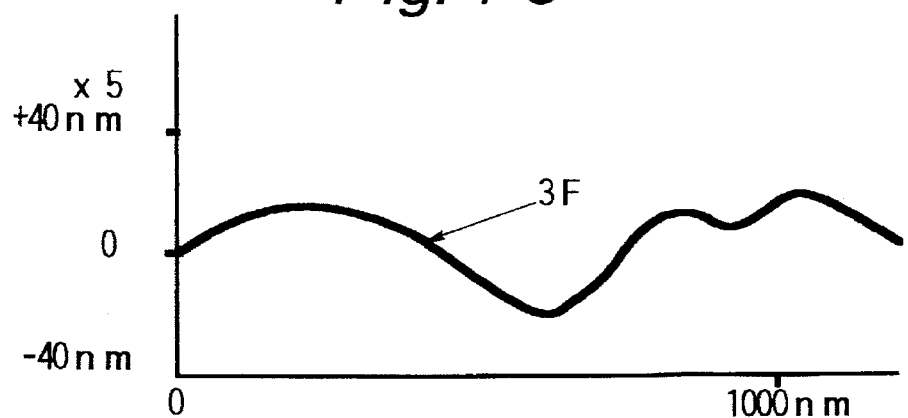
FIG. 4C is a graph showing a surface state of an antifuse material layer after the wet chemical pre-cleaning.
FIG. 4D is a graph showing a surface state of an antifuse material layer without the wet chemical pre-cleaning.
FIG. 4E is a histogram showing the distribution of breakdown voltage of an antifuse material film when the wet chemical pre-cleaning is applied and not applied.
Figure 4:
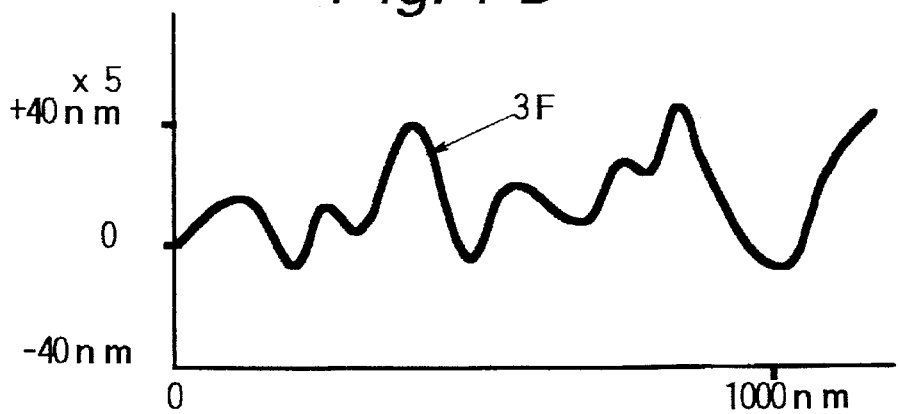
Figure 4:
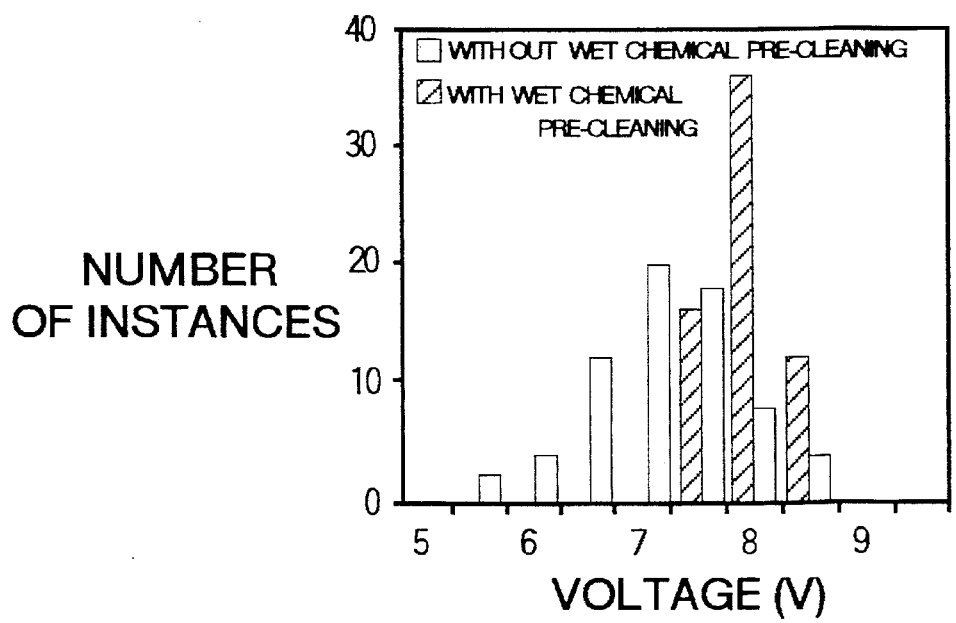

FIG. 4A is a histogram showing the distribution of the ON resistance for different amounts of Ti of the titanium nitride film 6A of the top electrode 6F after forming the filament 8. In comparison to the titanium nitride film having 50% of Ti, in the titanium nitride having 65% of Ti, the ON resistance as well as the dispersion of the ON resistance are small. FIG. 4B shows a relationship between the amount of Ti and average value of ON resistance in the titanium nitride film 6A of the top electrode 6F. As shown in the figure, the larger the amount of Ti, the smaller the ON resistance. There is seen a characteristic of abruptly decreasing the ON resistance with approximately a 55% boundary point, when the composition ratio of Ti is averaged in the range of 50%–60%.

FIG. 4C is a graph representing the surface shape of the bottom electrode 3F as a cross-sectional curve when the wet process (ammoniacal hydrogen peroxide water) is applied, while FIG. 4D represents the surface shape of the bottom electrode 3F as a cross-sectional curve when no wet process is applied to the bottom electrode 3F. As shown in FIGS. 4C and 4D, the surface of the wet-processed bottom electrode 3F has fewer sharp protrusions, with reduced unevenness and promoted smoothness.

FIG. 4E is a histogram showing a distribution of the breakdown voltage for the antifuse material film 7, comparing the wet process, and the same without wet process. When the wet process is applied, there is a small variation in the breakdown of the antifuse material film 7, showing uniform characteristics. Meanwhile, when no wet process is applied, the breakdown voltage for the antifuse material film 7 varies over a wide range.

In this embodiment since the bottom electrode 3F is formed of titanium silicide film or the tungsten silicide film of amorphous structure, no crystal grain boundary appears on the surface of the bottom electrode 3F, so that the surface of the bottom electrode 3F must be flattened. However, due to the gas supplied into the reactive chamber during the formation of the bottom electrode 3F, or atmospheric release between the processes (in the case of not being a vacuum system), oxide film or nitride film of poor quality will arise on the surface of the bottom electrode 3F to cause sharp protrusions on the surface of the oxide or nitride film. Namely, in the case of not performing the wet process, there will arise a local dielectric breakdown due to the sharp protrusion on the surface of the bottom electrode 3F. In addition, when the semiconductor device is operated for a long time and the operation voltage is applied between the bottom electrode 3F and the top electrode 6F, it is highly possible that a short-circuit will be generated between the bottom electrode 3F and the top electrode 6F which have to fundamentally be dielectrically separated (lowering the long-term reliability of the dielectric characteristics), which reduces the reliability of the semiconductor device.

In particular, when the tungsten silicide film is used for the bottom electrode 3F of the antifuse element, a negative (low) voltage is applied to the bottom electrode 3F, while a positive (high) voltage is applied to the top electrode 6F. Under such voltage conditions, when the breakdown voltage is applied for a short time, a large quantity of electron flow passes from the bottom electrode 3F to the top electrode 6F when the antifuse material layer is broken down. Namely a high current density instantaneously arises to supply W from the bottom electrode 3F to the filament 8 side. As a result, a sufficient amount of W is transported into the filament 8 so that it has an excellent EM resistance.

Figure 5:
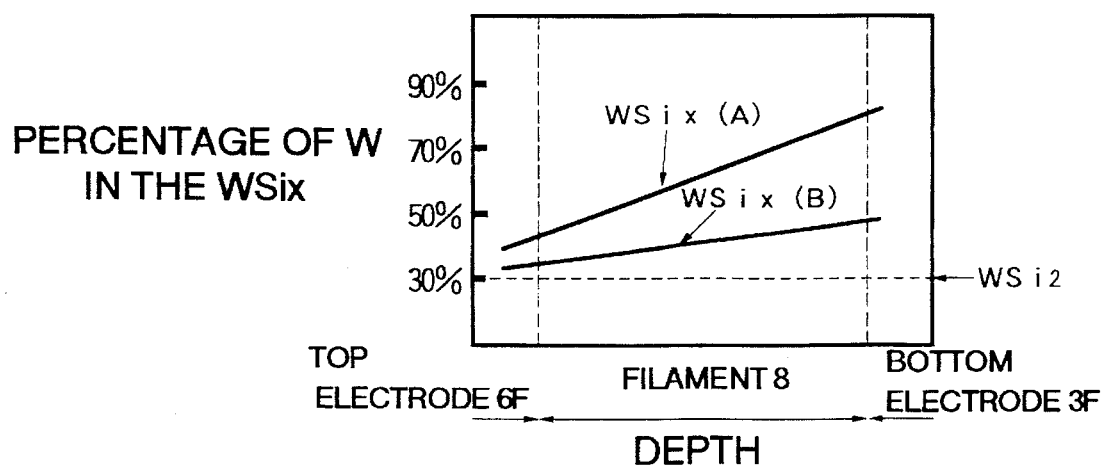
FIG. 5A is a graph showing the tungsten (W) content at differing parts of the filament and electrodes.
FIG. 5B is a graph showing a relationship between defectiveness and application of test voltage for different filament materials.
FIG. 5C is a histogram showing the distribution of ON resistance of the electrode for different tungsten amounts.
FIG. 5D is a graph showing a relationship between a metallic composition ratio and an ON resistance of an electrode.
Figure 5:
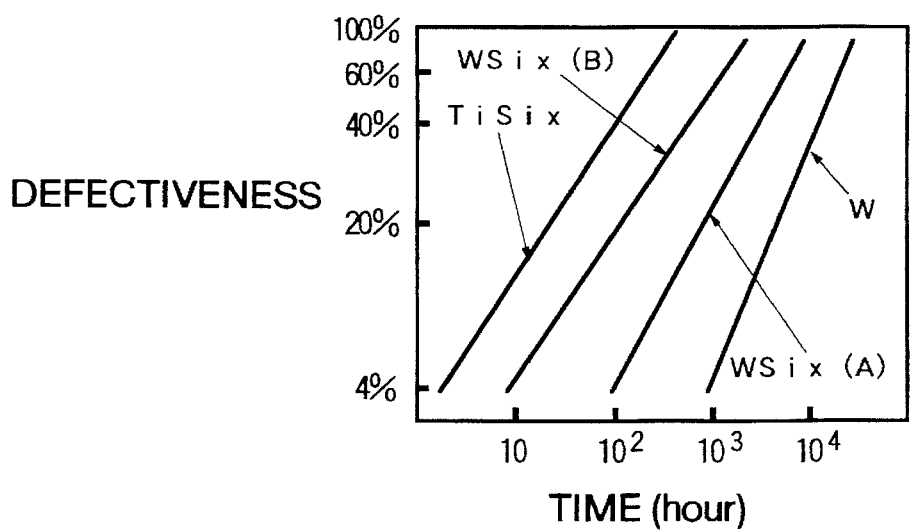

FIG. 5A shows a relationship between W content of the bottom electrode 3F and W content of the filament 8 in the antifuse element. In FIG. 5, the horizontal axis represents a depth of the filament 8, while the vertical axis represents a W composition percentage. Both data A and B represent W content in the filament 8 when the W content is set to be larger than the stoichiometric composition ratio. In the filament 8 the W content has almost the same tendency in both data A and B, gradually reducing in the direction from the bottom electrode 3F to the top electrode 6. However, when the bottom electrode 3F previously contains larger W than the stoichiometric composition ratio, for example when the bottom electrode 3F contains approximately 80% of W as shown in the data A, the filament 8 still contains a larger amount of W than the stoichiometric composition ratio. In the same manner, as shown in data B, when the bottom electrode 3F contains approximately 45-50% of W, the filament 8 still contains a larger amount of W than the stoichiometric composition ratio. As a result, the larger the W content in the bottom electrode 3F, the larger the W content in the filament 8.

FIG. 5B shows the W content at different parts of the filament 8 of the antifuse element. In FIG. 5B, the horizontal and vertical axes respectively represents the time for which a test voltage is applied and accumulative defectiveness rate such as disconnection. As shown in data A and B, increase of the W content in the filament 8 improves the EM resistance. The data A and B represent tungsten silicide film, which basically has more excellent EM resistance than the titanium silicide (TiSix) film. Naturally, when the filament 8 is wholly formed of W, namely when there is formed a W plug (or W through hole or W via hole), this W plug would have even further more excellent EM resistance than in the case of tungsten silicide film.

Thus the W of the tungsten silicide film of the bottom electrode 3F is taken into the filament 8 to improve the EM resistance. In addition, the larger the composition ratio of the tungsten silicide film, the larger the W content in the filament 8, so as to reduce the resistance in the filament 8.

Figure 5C:
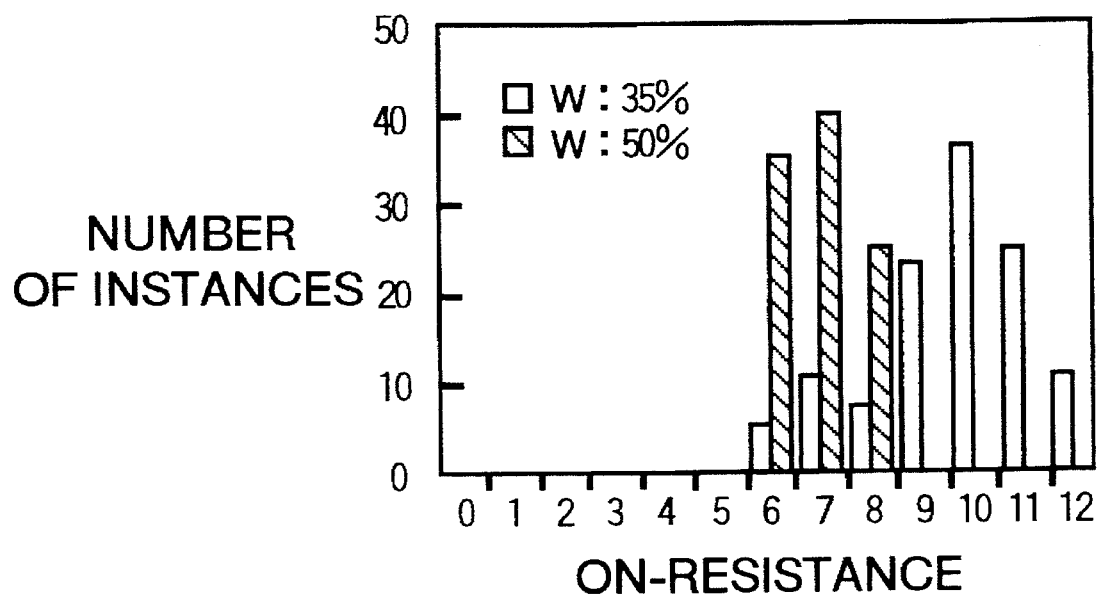

FIG. 5C is a histogram showing a distribution of the ON resistance for different composition amounts of W in the tungsten silicide film of the bottom electrode 3F after the antifuse material film 7 is broken down with the bottom electrode 3F as the negative electrode to write data. The tungsten silicide film having W composition amount of 50% has smaller ON resistance and dispersion in ON resistance than the film having a tungsten amount of 35%.

Figure 5D:
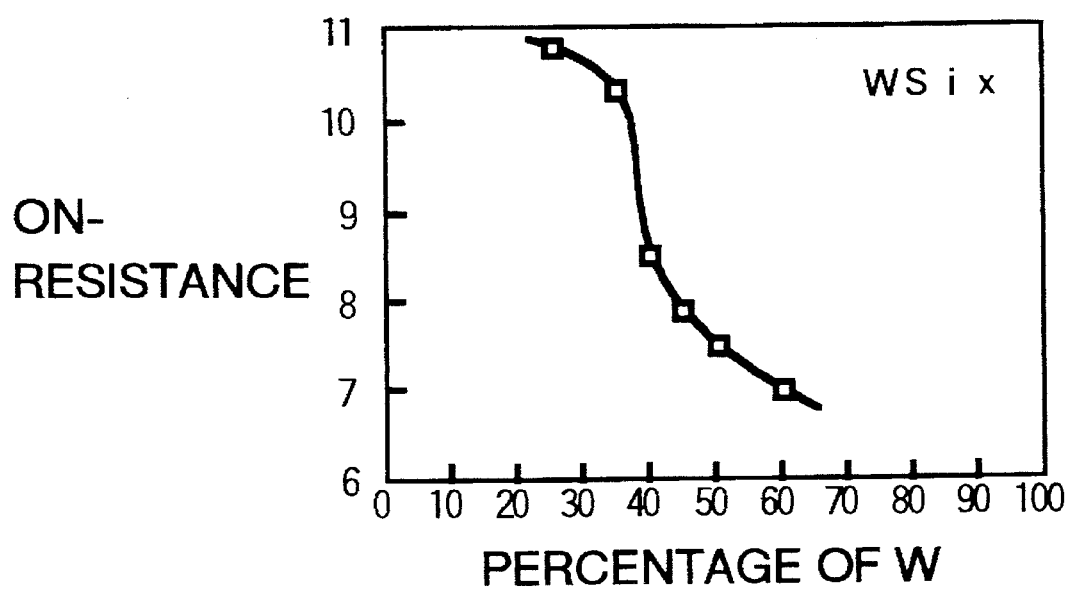

FIG. 5D is a graph showing a relationship between the composition amount of the tungsten silicide film of the bottom electrode 3F and the average value of the ON resistance after breakdown of the antifuse material film 7 with the bottom electrode 3F as the negative electrode to write the data. The larger the amount of W, the smaller the ON resistance. With 40% of the W composition ratio as a border, the ON resistance abruptly reduces.

As the bottom electrode of the antifuse element, as mentioned earlier, conductive materials of a variety of amorphous structures can be used. In addition, a metallic silicide film or a metallic nitride film can be used instead of the titanium nitride film 6A in the same manner as in the bottom electrode 3F. Further, any monolayer film such as titanium nitride film can be used in the top electrode 6F instead of the complex film including silicide titanium film and the titanium nitride film 6A.

Second Embodiment

In the second embodiment, the bottom electrode 3F of the antifuse element is formed having a crystal structure, not an amorphous structure, but is capable of providing the same characteristics as the amorphous structure by defining the crystal grain diameter, center line average height, and solid angle of the protrusion formed by the crystal grain diameter.

Figure 6:
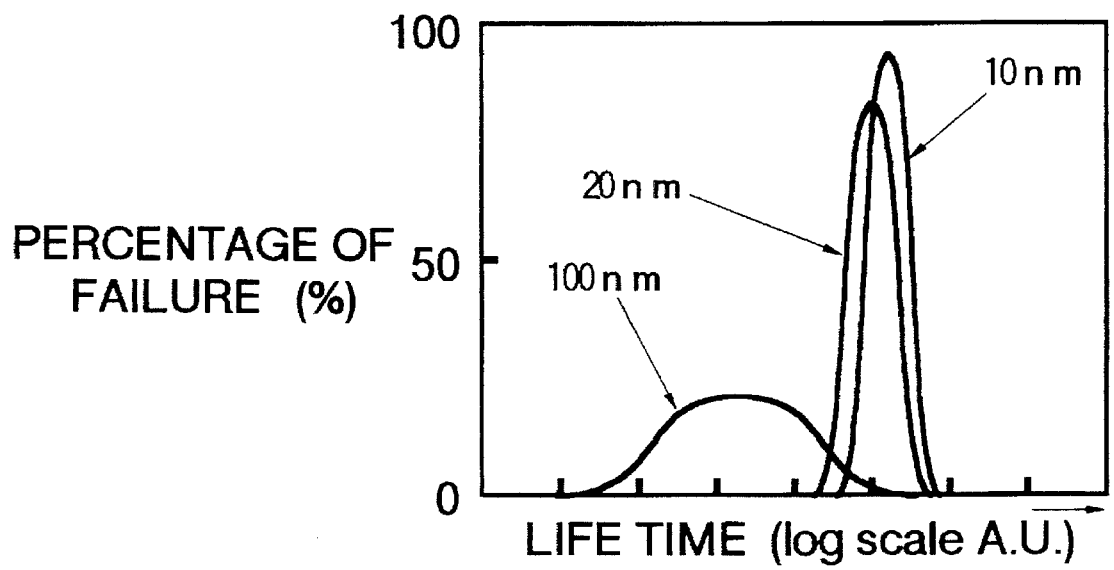
FIGS. 6A and 6B are graphs showing a relationship between a crystal grain size and lifetime and its deviation in an anfifuse element according to the second embodiment of this invention.
Figure 6:
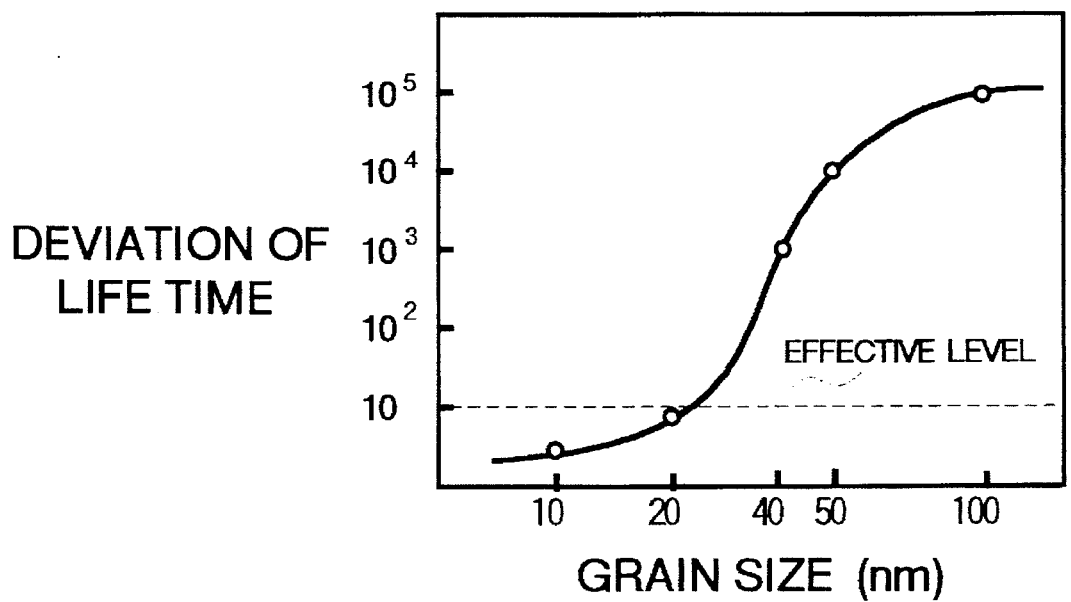

FIGS. 6A and 6B show a relationship between the crystal grain diameter of the bottom electrode 3F and the lifetime of the antifuse material film 7 until breakdown in the antifuse element. In FIG. 6A, the horizontal and vertical axes respectively represent the lifetime of the antifuse material film 7 to the breakdown, and the percentage of elements in the antifuse material film that break down. As shown in FIG. 6A there arise a significant dispersion in the lifetime when the crystal grain diameter of the bottom electrode 3F of the antifuse element is 100 nm. As the crystal grain diameter reduces to 20 nm, and 10 nm, the dispersion in the lifetime reduces so as to extend the lifetime before dielectric breakdown.

In FIG. 6B, the horizontal and vertical axes respectively represent the crystal grain diameter of the bottom electrode 3F and the deviation of lifetime of the antifuse element. As shown in FIG. 6B, it is necessary to set the crystal grain diameter to not exceeding 20 nm in order to suppress the lifetime dispersion to a practical level of one order of magnitude or less. Namely, when the crystal grains on the surface of the bottom electrode 3F are formed in a microsize of 20 nm or less, the sharp protrusions on the surface of the bottom electrode 3F are substantially smoothed.

Accordingly, the defectiveness density of the antifuse material film 7 formed on the surface of the bottom electrode 3F is reduced to provide good and uniform film quality.

Figure 7A:
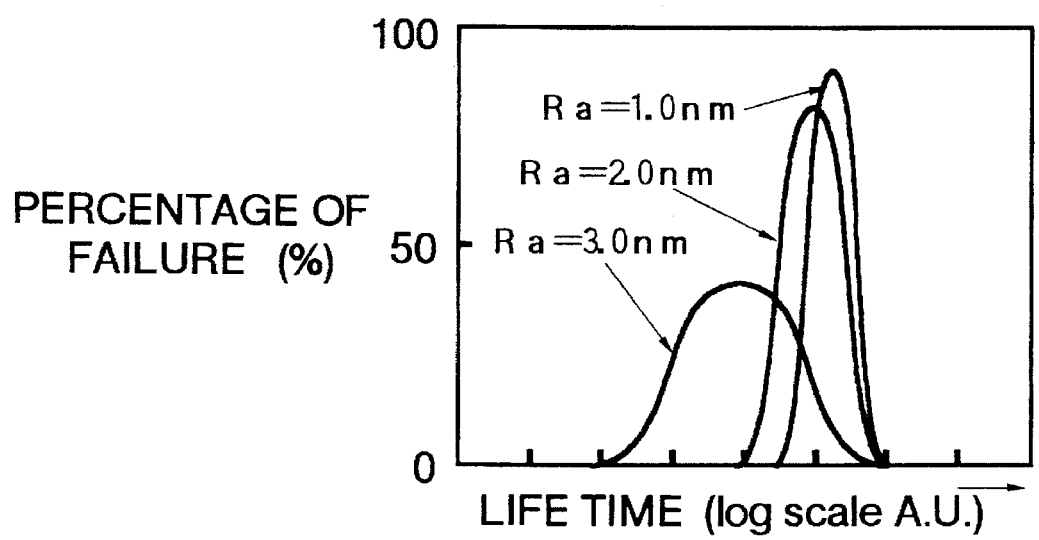
FIGS. 7A and 7B are graphs showing a relationship between a center line average height and lifetime and its deviation of an antifuse element.
Figure 7B:
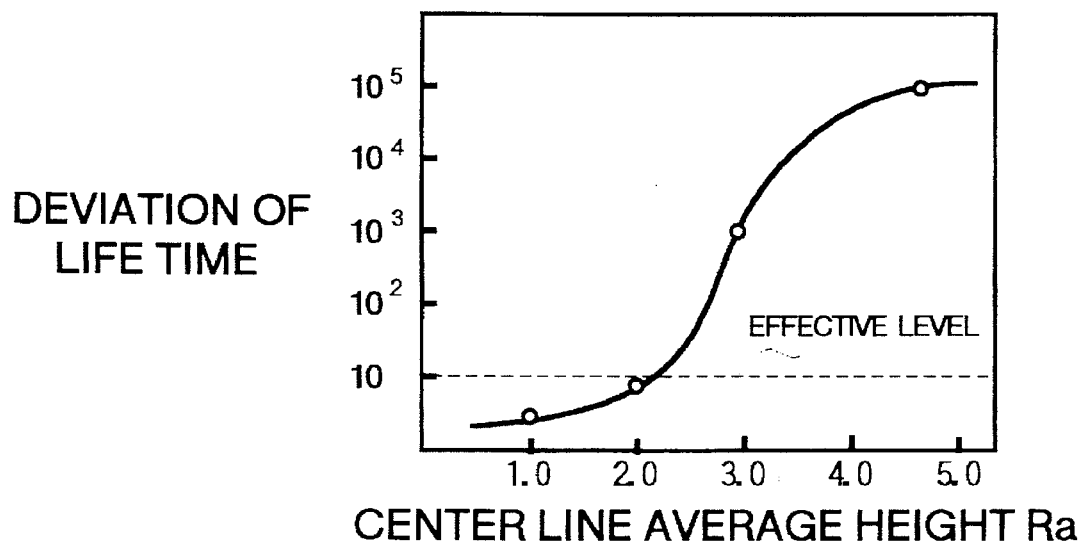

FIGS. 7A and 7B show a relationship between the roughness of the surface of the bottom electrode 3F and the lifetime of the antifuse material film 7 until the breakdown. In FIG. 7A the horizontal and vertical axes respectively represent the lifetime of the antifuse material film 7 until the breakdown and the percentage of elements in the antifuse material film 7 that break down. As shown in FIG. 7A, when the center line average height value Ra on the surface of the bottom electrode 3F is 3.0 nm, the lifetime dispersion is large. As the center line average height value Ra reduces to 2.0 nm, 1.0 nm, etc., the dispersion reduces to extend the lifetime until the dielectric breakdown.

In FIG. 7B, the horizontal and vertical axes respectively represent the center line average height value Ra on the surface of the bottom electrode 3F of the antifuse element, and the deviation of lifetime. As shown in FIG. 7B, it is necessary to set the center line average height value Ra to 2.0 nm or less for restrict the breakdown rate to a practical level. Namely, when the center line average height value Ra on the surface of the bottom electrode 3F is set to 2.0 nm or less, the sharp protrusions on the surface of the bottom electrode 3F are diminished to promote the smoothness. Accordingly, in the antifuse material film 7 formed on the surface of the bottom electrode 3F, the density of sharp protrusions is reduced to provide good and uniform film quality.

Figure 8:
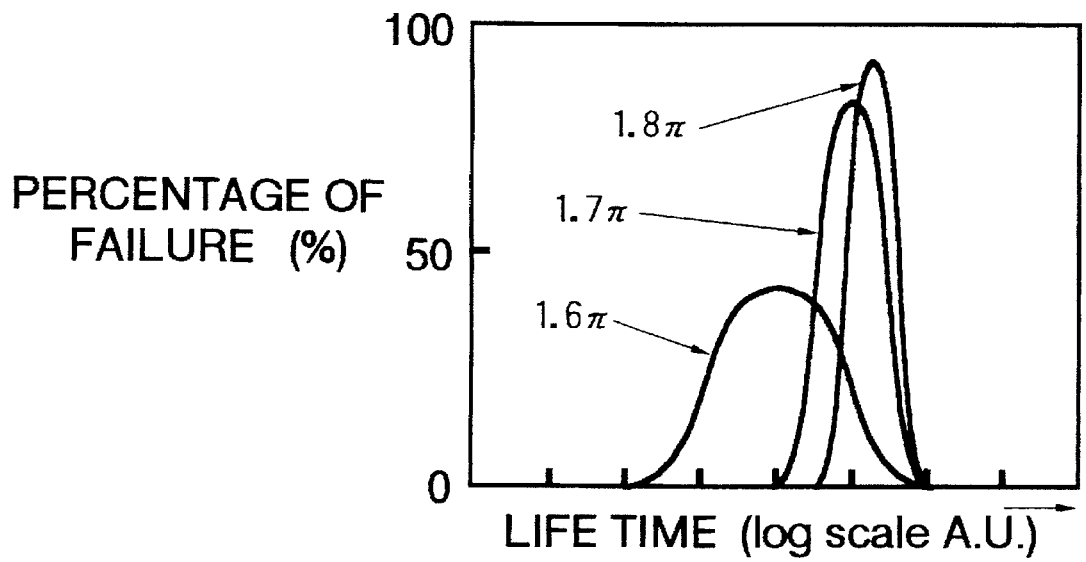
FIGS. 8A and 8B are graphs showing a relationship between a solid angle of crystal grains and lifetime and its deviation of an antifuse element.
Figure 8:
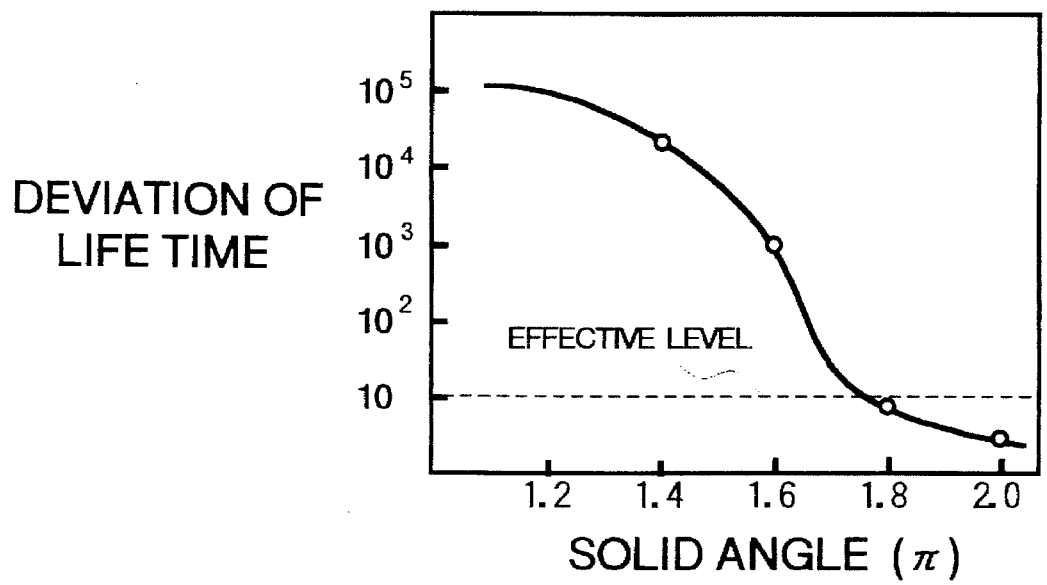

FIGS. 8A and 8B show a relationship between a solid angle of crystal grain of a particular size on the surface of the bottom electrode 3F of the antifuse element and the lifetime of the antifuse material film 7 until the breakdown. In FIG. 8A the horizontal and vertical axes respectively represent the lifetime of the antifuse material film until breakdown and the percentage of occurrences of breakdown of the antifuse material film. As shown in FIG. 8A, when the solid angle of the crystal grains having a size of not less than 1 nm and not exceeding 1 μm is 1.6π, a large lifetime dispersion arises. As the solid angle becomes smaller, i.e., 1.7π, 1.8π, etc., the variation in the lifetime of the antifuse material film reduces to extend the life up to the dielectric breakdown.

In FIG. 8B the horizontal and vertical axes respectively represent a solid angle of the crystal grain on the surface of the bottom electrode 3F of the antifuse element and the deviation of lifetime. As shown in FIG. 8B, the solid angle must be set to 1.8π or more to restrict the lifetime dispersion to a practical level. For reference, a solid angle of 2.0π signifies a perfectly smoothed state. In other words, when the solid angle of the crystal grain on the surface of the bottom electrode 3F is set to be not less than 1.8π, the sharp protrusions on the surface of the bottom electrode 3F are diminished to promote the smoothness. Accordingly, the density of sharp protrusions in the antifuse material film 7 formed on the surface of the bottom electrode 3F is reduced to provide good and uniform film quality.

Third Embodiment

In the third embodiment of this invention, the bottom electrode is formed on an element separator for dielectrically separating between semiconductor elements, specifically between complementary MISFETs (Metal Insulator Semiconductor Field Effect Transistor). The antifuse element is composed of the bottom electrode, the antifuse material film and the top electrode. In this embodiment, a complex film, a so called policide film formed by silicon film and silicide film accumulated on the silicon film, is used as the bottom electrode.

Figure 9A:
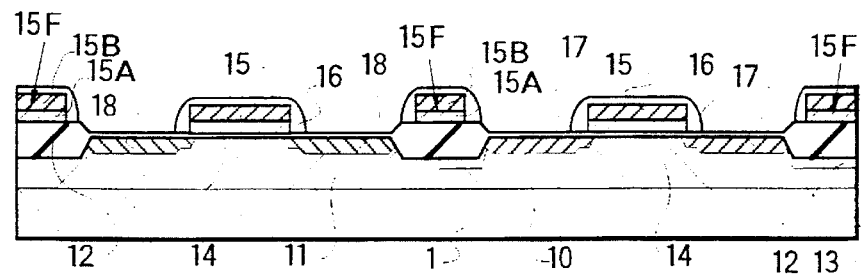
FIGS. 9A, 9B, 9C, 9D and 9E are cross-sectional views showing fabrication processes in manufacturing antifuse elements for a semiconductor device according to a third embodiment of this invention.
Figure 9B:
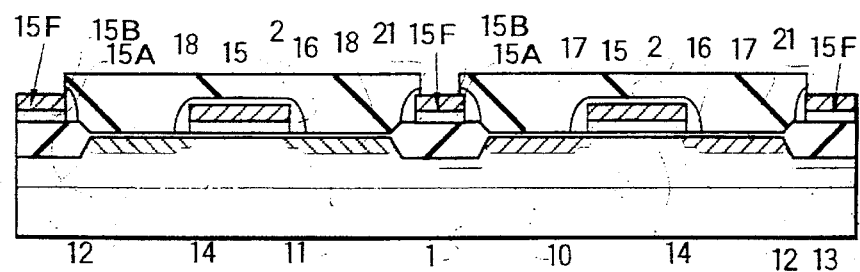
Figure 9C:
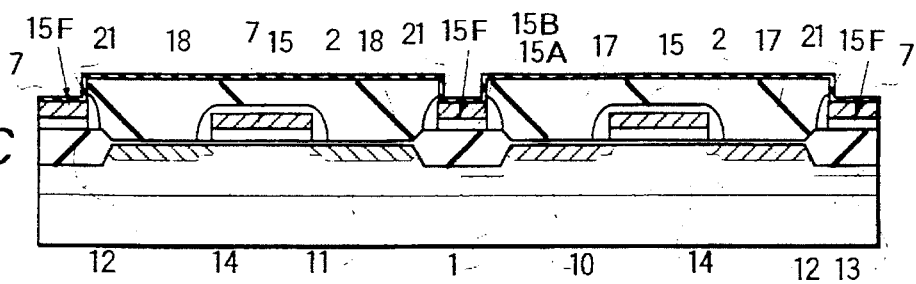
Figure 9D:
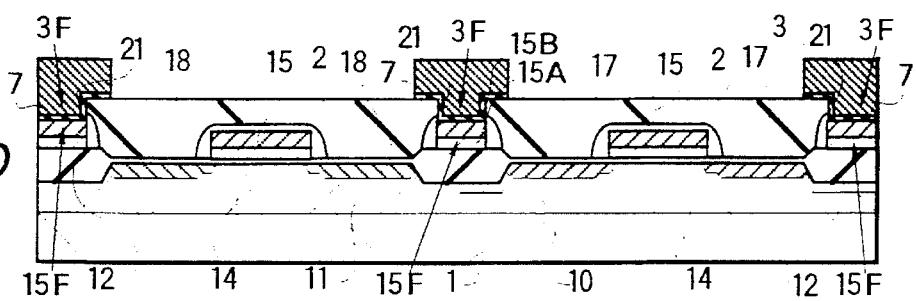
Figure 9E:
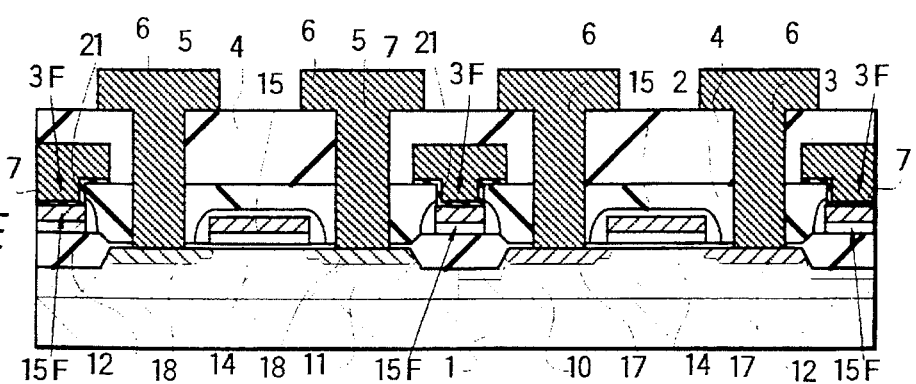

FIGS. 9A and 9E are cross-sectional views showing manufacturing processes for manufacturing antifuse elements for a semiconductor device according to a third embodiment of this invention.

In the first process, as shown in FIG. 9 A, a bottom electrode 15F of the antifuse element is formed on an element separator (insulator) 12 for dielectrically separating the complementary MISFETs. The bottom electrode 15F, in this embodiment, is formed of a layered film of the silicon film 15A and the tungsten silicide (WSix) film 15B, namely the policide film. The silicon film 15A has an amorphous or polycrystal structure formed by the CVD method or the sputtering method, and the silicon film 15A has a thickness of approximately 150 nm. In the case of using the CVD method, for example, there are used such accumulating conditions as: substrate temperature 600° C.; $SiH_4$ 100 sccm; and pressure 0.3 tort. Just after the accumulation by the CVD method, P is introduced into the silicon film 15A to reduce the resistance value. P is introduced by ion implantation under such conditions as: dose amount $7.0 \times 10^{15}$ atoms/cm$^2$; and introducing energy 30 KeV. The tungsten silicide film 15B is formed by a normal sputtering method to provide a thickness of 200 nm, for example. The bottom electrode 15F of such a layered structure is manufactured in the same fabrication process as for the gate electrode 15 of the MISFET in this embodiment. It is possible to reduce the number of manufacturing processes by forming the bottom electrode 15F of the antifuse element and the gate electrode 15 of MISFET in the same process, compared to a case of manufacturing the two electrodes using separate processes.

In addition, as mentioned in the first embodiment, a temperature range of 800° C. or less, namely a range where no crystal growth appears, is used for the formation of the tungsten silicide film 15B, so that the tungsten silicide film 15B has an amorphous structure. As mentioned in the embodiment 2, the tungsten silicide film 15B is formed by microcrystal grains set to be 20 nm or less. In both cases, the smoothness of the surface of the tungsten silicide film, namely the surface of the bottom electrode 15F, can be promoted.

The complementary MISFET is formed of an n-channel MISFET and a p-channel MISFET. The n-channel MISFET is formed in a p-type well region 10 within an area surrounded by the element separator 12 and a p-channel stopper region 13. The p-channel MISFET is formed in the n-type well region 11 within an area surrounded by the element separator 12. Both the p-type well region 10 and the n-type well region 11 are formed on the p-type semiconductor substrate 11. The element separator 12 is formed by a thick field oxide film made by oxidizing the surface of the semiconductor substrate 1 by a selective oxidizing method.

The n-channel MISFET includes a p-type well region 10 as a channel forming region, a gate insulating film 14, a gate electrode 15, and a pair of n-type semiconductor region 17 as a source region and drain region. The p-channel MISFET includes an n-type well region 11 as a channel forming region, a gate insulating film 14, a gate electrode 15, and a pair of p-type semiconductor regions 18 as the source region and drain region. Both MISFETs are not necessarily limited to such a structure, but may adopt an LDD (Lightly Doped Drain) structure. In the n-channel MISFET using the LDD structure, a side wall spacer 16 is formed at the side wall of the gate electrode 15 to set the channel forming region side of the n-type semiconductor region 17, particularly the drain region, to a low impurity density. In the p-channel MISFET using the LDD structure, the side wall spacer 16 is formed at the side wall of the gate electrode 15, so that the channel forming region side of the p-type semiconductor region 18, in particular the drain region, is set to have lower impurity density. The manufacturing method of a MISFET using such a type of LDD structure is well known so as to be omitted from explanation.

In this embodiment the semiconductor substrate 1 is formed of a twin-well structure having the p-type well region 10 and the n-type well region 11, but is not limited thereto. Namely, it is also possible, for example, to form the semi-conductor substrate in p-type as a single well structure omitting the p-type well region 10.

In the second process, the inter-layer dielectric film 2 is formed over the whole surface of the semiconductor substrate 1 including the region over the bottom electrode 15F. As shown in FIG. 9B, an antifuse opening 21 is formed in the inter-layer dielectric film 2 in the forming region of the antifuse element. The surface of the bottom electrode 15F is exposed in the antifuse opening 21.

In the third process, in the same manner as the first embodiment, the wet process using ammoniacal hydrogen peroxide is applied to the surface of the bottom electrode 15F, namely the surface of the tungsten silicide film 15B of the top layer. Further an isotropic chemical dry etching process using fluorine gas is used. It is possible, using this process, to promote the smoothness of the surface of the tungsten silicide film 15B.

In the fourth process, as shown in FIG. 9C, the antifuse material film 7 is formed on the surface of the tungsten silicide film 15B within the antifuse opening 21. The antifuse material film 7 is formed under the same conditions as in the first embodiment, so as to render a lower defect density, and uniform and excellent film quality.

In the fifth process, as shown in FIG. 9D, the metal interconnects 3 are formed in the first level metal interconnect layer, and the top electrode 3F of the antifuse element is formed by the same manufacturing process. In this embodiment, the metal interconnects 3 and the top electrode 3F are formed by a three-layer structure of titanium nitride film, aluminum alloy film and titanium nitride film, in that order. The bottom titanium nitride film is accumulated by the sputtering method to have a film thickness of 100 nm, for example. The aluminum alloy film is accumulated by the sputtering method to have a film thickness of 800 nm, for example. The top titanium nitride film is formed by the sputtering method to have a film thickness of 30 nm, for example. The antifuse material film 7 is patterned at the same time as the top electrode 3F, the top electrode acting as a mask for the antifuse material film 7.

At the time of completion of this process, there is formed an antifuse element including the bottom electrode 15F (actually the tungsten silicide film 15B), the antifuse material film 7 and the top electrode 3F.

In the sixth process, the inter-layer dielectric film 4 and the through hole 5 are formed sequentially, and the metal interconnects 6 are formed in the second level metal interconnect layer as shown in FIG. 9E thereafter. Although not shown, a final passivation film 9 is formed on the metal interconnects 6.

Fourth Embodiment

In the fourth embodiment 4, the bottom electrode is formed on the element separator for separating the complementary MISFETs with an insulator, and the antifuse element is composed of the bottom electrode, the antifuse material film and the top electrode. A silicide film of monolayer is used as the bottom electrode of the antifuse element.

FIGS. 10A–E are cross-sectional views showing manufacturing processes of antifuse elements for a semiconductor device according to the fourth embodiment of this invention.

Figure 10A:
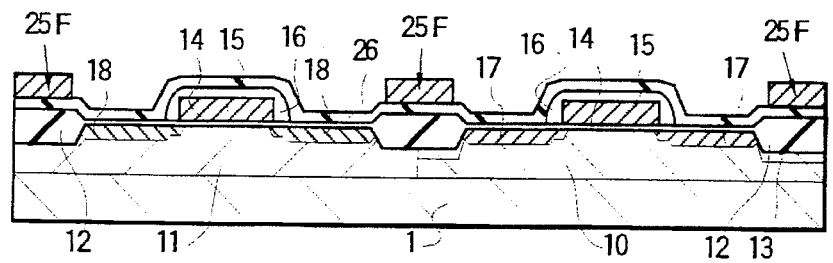
FIGS. 10A, 10B, 10C, 10D and 10E are cross-sectional views showing fabrication processes in manufacturing antifuse elements for a semiconductor device according to a fourth embodiment of this invention.

In the first process, as shown in FIG. 10A, the bottom electrode 25F of the antifuse element is formed by inserting an inter-layer dielectric film 26 on the element separator 12 after forming the complementary MISFET. In this embodiment, the bottom electrode 25F is formed of a monolayer film of Ti-Si-N film having an amorphous structure. The Ti-Si-N film is formed by the reactive sputtering method to have a film thickness of approximately 400 nm, for example. In the reactive sputtering method, the $TiSi_2$ target material is used in the $Ar-N_2$ mixed gas atmosphere under such conditions as: pressure $1.0 \times 10^{-3}$ torr; and power 0.5 KW. The composition ratio of the Ti-Si-N film is Ti:Si:N=1:2:3, which is capable of maintaining the amorphous structure even after 30 minutes of annealing at a temperature of 800° C. or less. In this embodiment, the bottom electrode 25F having such a monolayer structure is formed on the top layer of the gate electrode 15 after the formation of the gate electrode 15.

The Ti-Si-N film can also be formed by a crystal structure with micro-size grain diameter of 20 nm or less, as mentioned in the second embodiment, not being limited to the amorphous structure. Also in this case, the smoothness of the surface of the Ti-Si-N film, namely the surface of the bottom electrode 25F, is promoted.

The silicon oxide film, for example having been accumulated by the CVD method with low temperature and low pressure, is used as the inter-layer dielectric film 26 to have a film thickness of 100–200 nm, for example.

Figure 10B:
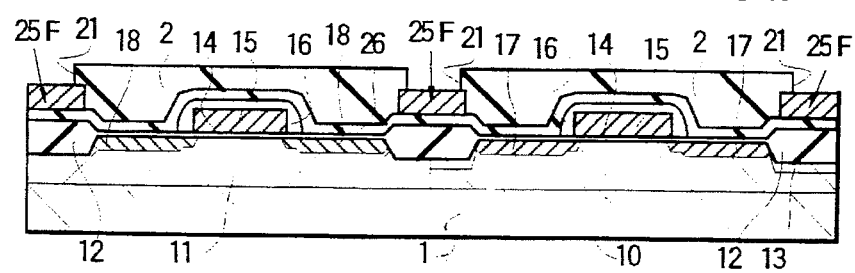

In the second process, the inter-layer dielectric film 2 is formed over the whole substrate including the part over the bottom electrode 25F, and thereafter the antifuse opening 21 is formed in the inter-layer dielectric film 2 in the antifuse element forming region as shown in FIG. 10B. In the antifuse opening 21 the surface of the bottom electrode 25F is exposed.

In the third process, similarly to the first embodiment, the wet process using the ammoniacal hydrogen peroxide water is applied to the exposed surface of the bottom electrode 25F in the antifuse opening 21. Further, an isotropic chemical dry etching process using fluorine gas is applied thereto. By this process, the surface of the upperlayer is promoted to be smoothed.

Figure 10C:
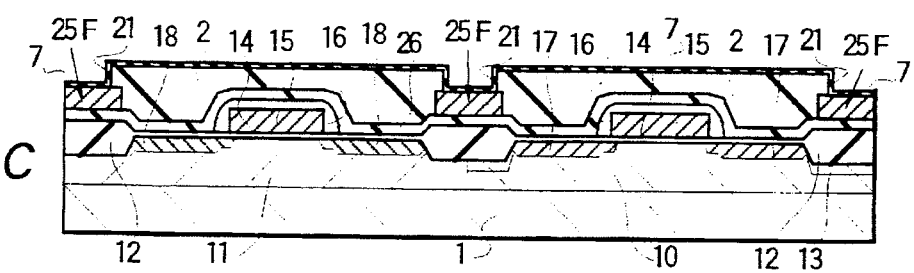

In the fourth process, as shown in FIG. 10C, the antifuse material film 7 is formed over the whole exposed surface of the inter-layer dielectric film 2 including the region over the bottom electrode 25F in the antifuse opening 21. The antifuse material film 7 is formed under the same conditions as in the first embodiment, so as to provide an antifuse material film with a lower defect density and a uniform and excellent film quality.

Figure 10D:
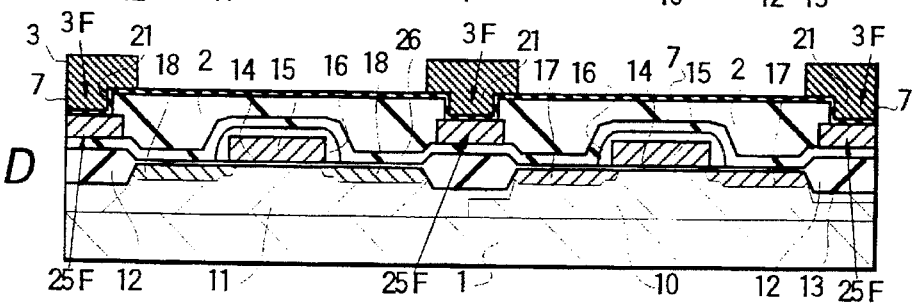

In the fifth process, as shown in FIG. 10D the metal interconnects 3 are formed in the first level metal interconnect layer, and the top electrode 3F of the antifuse element is formed by the same fabrication process. The metal interconnects 3 and the top electrode 3F are formed by the 3-layer structure composed of sequentially layered titanium nitride film, aluminum alloy film, and titanium nitride film. The antifuse material film 7 is patterned at the same time as the top electrode 3F, the top electrode 3F acting as a mask for the antifuse material film 7.

Upon completion of this process, there will be formed an antifuse element including the bottom electrode 25F, the antifuse material film 7 and the top electrode 3F.

Figure 10E:
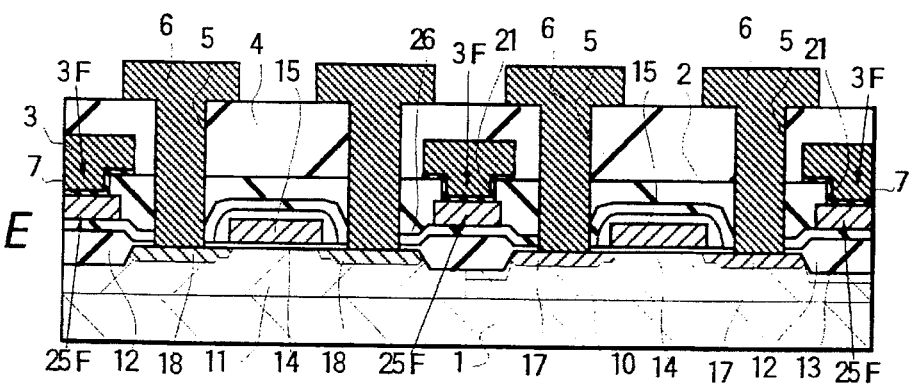

In the sixth process, the inter-layer dielectric film 4 and the through hole 5 are sequentially formed, and thereafter the metal interconnects 6 are formed in the second level metal interconnect layer as shown in FIG. 10E. Though not shown, a final passivation film 9 is formed on the metal interconnects 6.

Fifth Embodiment

In the fifth embodiment, the bottom electrode of the antifuse element is formed as a layered film in the bottom metal interconnect layer, and a tungsten silicide film having an amorphous structure is formed on the top layer of this layered film.

FIGS. 11A–11E are cross-sectional views showing manufacturing processes of antifuse elements for a semiconductor device according to a fifth embodiment of this invention.

Figure 11A:
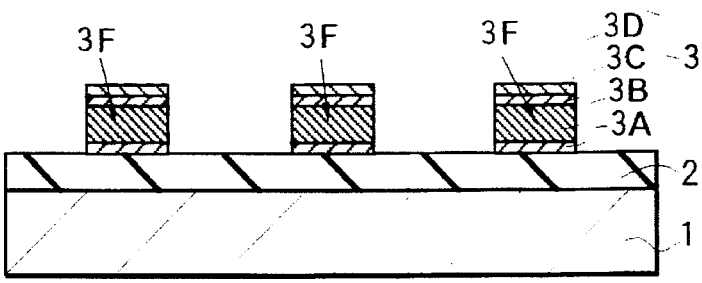
FIGS. 11A, 11B, 11C, 11D and 11E are cross-sectional views showing fabrication processes in manufacturing antifuse elements for a semiconductor device according to a fifth embodiment of this invention.

In the first process, as shown in FIG. 11A, the metal interconnects 3 are formed in the first metal interconnect layer on the surface of the inter-layer dielectric film 2 as a base, and the bottom electrode 3F of the antifuse element is formed by the same fabrication process. In this embodiment, both the metal interconnects 3 and the bottom electrode 3F are formed by a complex film formed by sequentially layering the titanium nitride (TiN) film 3A, aluminum (Al - Cu) alloy film 3B, titanium nitride film 3C, and tungsten silicide (WSix) film 3D. The titanium nitride film 3A being a bottom layer of the metal interconnects 3 is used as a barrier metallic film to have a film thickness of 100 nm. The aluminum alloy film 3B is used as a mother material of the wires 3 to have a film thickness of 800 nm. The titanium nitride film 3C is used as an alloy spike-preventing film to have a film thickness of 300 nm. The tungsten silicide film 3D arranged on the top layer of the metal interconnects 3 is used as a reaction preventing film and is formed by the sputtering method to have a film thickness of 50 nm. For the sputtering, a target material having a composition ratio of W:Si=1:1.8 is used.

Furthermore, as mentioned in the first embodiment, a temperature range without any crystal growth is used in the tungsten silicide film 3D of the bottom electrode 3F, so that the tungsten silicide film 3D is formed having an amorphous structure. For example, the tungsten silicide film 3D is accumulated under the conditions where the substrate temperature is set to 100° C. Since no crystal grain field exists on the surface of the tungsten silicide film 3D accumulated under such conditions, the smoothness of the surface of the tungsten silicide film 3D is promoted.

Figure 11B:
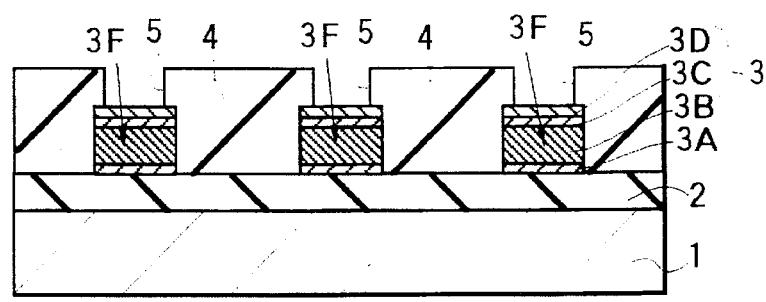
Figure 11C:
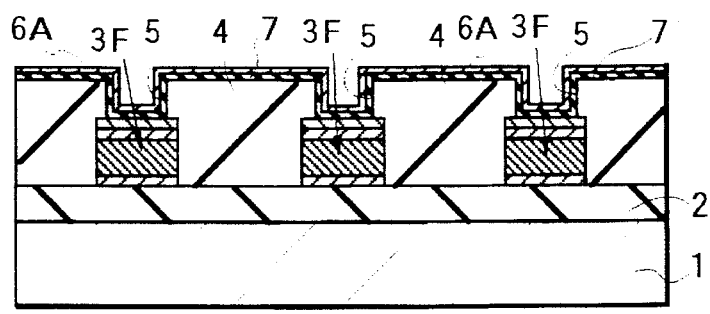

In the second process, the inter-layer dielectric film 4 is formed over the whole surface including the region over the metal interconnects 3 and the bottom electrode 3F, and thereafter, as shown in FIG. 11B, the antifuse opening 5F is formed in the antifuse element forming region. The surface of the bottom electrode 3F, namely the tungsten silicide film 3D of the top layer, is exposed in the antifuse opening 5F.

In the third process, a wet process using ammoniacal hydrogen peroxide water is applied to the exposed surface of the tungsten silicide film 3D of the bottom electrode 3F in at least the antifuse opening 5F, similarly to the first embodiment. Further, an isotropic chemical dry etching process is carried out using fluorine gas. This process will act to promote the smoothness of the surface of the tungsten silicide film 3D.

In the fourth process, the antifuse material film 7 and the top electrode 6F are sequentially formed over the whole exposed surface of the inter-layer dielectric film 4 including the region over the bottom electrode 3F in the antifuse opening 5F. The antifuse material film 7 is formed under the same conditions as in the first embodiment so as to provide the antifuse material film 7 with a lower density of sharp protrusions and a uniform and excellent film quality. The top electrode 6F is formed of titanium nitride film, for example, which is used as a barrier metal film for the metal interconnects formed in the first level metal interconnect layer. The titanium nitride film is accumulated, for example by a sputtering method, to have a film thickness of 50 nm.

Figure 11D:
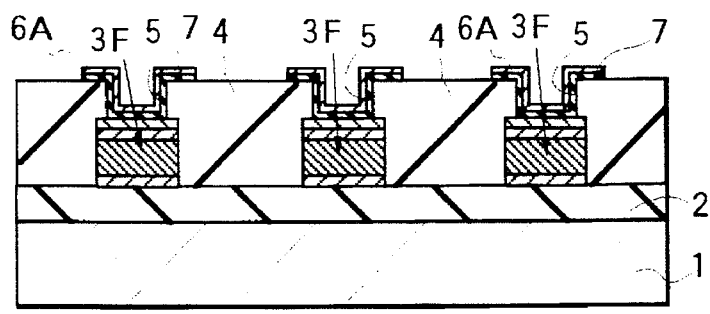

In the fifth process, as shown in FIG. 11D, the top electrode 6F and the antifuse material film 7 are sequentially patterned. Upon completion of this process, the antifuse element being composed of the bottom electrode 3F (tungsten silicide film 3D), the antifuse material film 7 and the top electrode 6F, is formed.

Figure 11E:
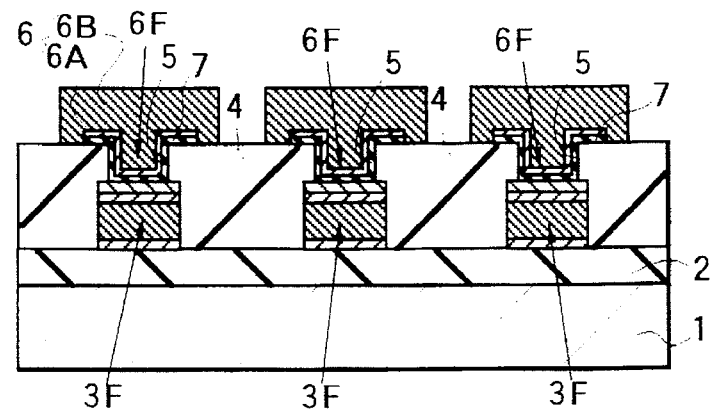

In the sixth process, the wires 6B are formed in the second level metal interconnect layer over the whole surface including the region over the top electrode 6F. The metal interconnects 6B are formed by an aluminum alloy film, for example, to have a film thickness of 800 nm. Thereafter, as shown in FIG. 11E, the metal interconnects 6B will be patterned.

In the seventh process, a not shown final passivation film 9 is formed on the metal interconnects 6B.

The present invention is not limited to the aforementioned embodiments, but can be variably modified without departing from the essential concept thereof.

For example, the present invention can be applied also to a semiconductor device of multi-layered metal interconnects structure of three or four or more metal interconnect layers.

Moreover, the present invention can be applied to a printed metal interconnect substrate, or metal interconnect-forming technology using antifuse elements.

As mentioned above, according to the present invention the following advantages can be obtained:

Firstly, the present invention can reduce the dispersion of ON resistance between the top electrode and the bottom electrode of the first level metal interconnect layer of the antifuse element to improve the reliability;

Secondly, the electric connection and dielectric separation between the top electrode and the bottom electrode of the antifuse element can be reliably carried out, so that the breakdown voltage of the antifuse material film can be set to a lower value, providing low operational voltage;

Thirdly, the ON resistance between the top electrode and the bottom electrode can be reduced to enhance the operational speed; and Fourthly, the EM resistance of the filament formed between the top electrode and the bottom electrode can be enhanced.

What is claimed is:

1. An antifuse element in an integrated circuit device, the integrated ciucuit device being formed within and on a substrate, the antifuse element being capable of assuming a programmed state and an unprogrammed state and comprising:

a bottom electrode including at least an uppermost layer thereof made from a conductive material having an amorphous structure;

a top electrode; and an antifuse material layer sandwiched between the bottom and top electrodes.

2. The antifuse element according to claim 1, wherein one of the top electrode and a lowermost portion of the top electrode of the antifuse element is formed of a conductive material having an amorphous structure.

3. The antifuse element according to claim 1, wherein the conductive material having an amorphous structure is any of the following elements or compounds (1)–(10):

(1) at least two elements of a first element group including Fe, Co, Ni, Cu, Mn, Ti, V, Cr, Zr, Nb, Mo, Hf, Ta and W;

(2) a compound formed by at least one element of the first element group and at least one element of a second element group including Si, B, N, C, Ge, As, P and Sb;

(3) a compound formed by at least one element of the first element group, at least one element of the second element group and one element of a third element group including Y and La;

(4) a compound formed by at least one element of the first element group and Al;

(5) a compound formed by at least one element of the third element group and Al;

(6) a compound formed by at least one element of the first element group, at least one element of the third element group, and Al;

(7) a compound formed by any one element of a fourth element group including Au, Pt, Pd and Ag, and at least any one element of the second element group;

(8) a compound formed by at least one element of the first element group and any one element of the fourth element group;

(9) a compound formed by at least any one element of the third element group and any one element of the fourth element group; and

(10) a compound formed by at least any one element of the first element group, at least any one element of the third element group, and any one element of the fourth element group.

4. The antifuse element according to claim 1, wherein the antifuse material film is formed of a single layer of silicon oxide, silicon nitride, or tantalum oxide, or a multi-layer combination of at least two of silicon oxide, silicon nitride and tantalum oxide.

5. The antifuse element according to claim 3, wherein the conductive material is a compound formed by metallic elements and non-metallic elements having a metallic composition ratio that is larger than a stoichiometric composition ratio.

6. The antifuse element according to claim 1, wherein the bottom electrode includes a silicon oxide film formed by removing the surface thereof, and the antifuse material film is formed on the silicon oxide film.

7. The antifuse element according to claim 3, wherein:
the bottom electrode is formed in a first level metal interconnect of the semiconductor device, and the top electrode is formed in a second level metal interconnect layer of the semiconductor device which is mounted over the first level metal interconnect layer.

8. The antifuse element according to claim 3, wherein:
the bottom electrode is formed on a dielectric separator for dielectrically separating semiconductor elements from each other.

9. A semiconductor device including at least one antifuse element defined in claim 1.

10. The antifuse element according to claim 3, wherein said conductive material having the amorphous structure is a compound formed by at least one element of the first element group and at least one element of the second element group including Si, B, N, C, Ge, As, P and Sb.

11. The antifuse element according to claim 10, wherein said compound is one of WSi, MoSi and Ti-Si-N.

12. The antifuse element according to claim 4, wherein the antifuse material film comprises a silicon nitride film having a thickness of 5 nm to 20 nm.

13. The antifuse element according to claim 5, wherein the metallic composition ratio of W in WSi is 45–50% and the metallic composition ratio of Ti in TiN is 50–60%.

* * * * *